(12) United States Patent
Chen (10) Patent No.: US 6,940,176 B2
(45) Date of Patent: Sep. 6, 2005

(54) SOLDER PADS FOR IMPROVING RELIABILITY OF A PACKAGE

(75) Inventor: Kuo-Ming Chen, Hsin-Chu Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/063,880

(22) Filed: May 21, 2002

(65) Prior Publication Data

US 2003/0218243 A1 Nov. 27, 2003

(51) Int. Cl.[7] .......................... H01L 23/48; H01L 23/52; H01L 29/40
(52) U.S. Cl. ..................... 257/778; 257/686; 257/723
(58) Field of Search ............................ 257/737, 738, 257/777, 778, 784, 786, 685, 686, 723, 780; 438/613–617, 610; 228/180.22

(56) References Cited

U.S. PATENT DOCUMENTS

| | | | | |
|---|---|---|---|---|
| 5,153,379 A | * | 10/1992 | Guzuk et al. ............. 174/35 R |
| 5,216,278 A | * | 6/1993 | Lin et al. | |
| 5,569,960 A | * | 10/1996 | Kumazawa et al. ........ 257/738 |
| 5,741,729 A | * | 4/1998 | Selna ......................... 438/125 |
| 6,008,534 A | * | 12/1999 | Fulcher ..................... 257/691 |
| 6,107,685 A | * | 8/2000 | Nishiyama | |
| 6,265,783 B1 | * | 7/2001 | Juso et al. | |
| 6,350,669 B1 | * | 2/2002 | Pu et al. | |
| 6,365,978 B1 | * | 4/2002 | Ibnabdeljalil et al. ....... 257/786 |
| 6,404,062 B1 | * | 6/2002 | Taniguchi et al. .......... 257/778 |
| 6,444,563 B1 | * | 9/2002 | Potter et al. ............... 438/615 |
| 6,518,677 B1 | * | 2/2003 | Capote et al. .............. 257/783 |

FOREIGN PATENT DOCUMENTS

| | | |
|---|---|---|
| JP | 07-161910 | 6/1995 |
| JP | 2001-257289 | * 9/2001 |
| JP | 2001-319997 | 11/2001 |

* cited by examiner

Primary Examiner—Hoai Pham
Assistant Examiner—Dilinh Nguyen
(74) Attorney, Agent, or Firm—Winston Hsu (57) ABSTRACT

Solder pads for improving reliability of a semiconductor package are provided. The package includes a substrate and/or a chip. The solder pad includes a plurality of first solder pads located on a surface of the substrate and/or the chip, and at least a second solder pad located on a predetermined region of the surface of the substrate and/or the chip. Each of the first solder pads has a first diameter. The second solder pad has a second diameter greater than the first diameter so as to sustain a stronger thermal stress on the substrate and/or the chip.

20 Claims, 6 Drawing Sheets

SOLDER PADS FOR IMPROVING RELIABILITY OF A PACKAGE

BACKGROUND OF INVENTION

1. Field of the Invention

The present invention relates to solder pads of a package, and more particularly, to solder pads for improving reliability of a package.

2. Description of the Prior Art

High performance microelectronic devices often use solder balls or solder bumps for electrically and mechanically interconnection to other microelectronic devices. For instance, a very large scale integration (VLSI) chip may be connected to a circuit board or other next level packaging substrate by using solder balls or solder bumps. This connection technology is also referred to as "flip chip" technology. The flip chip technology is an area array connection technology and includes reflowing a body of solder onto a bond pad to form a solder bump, so as to electrically connect an IC die to a packaging board. The flip chip can break through limitations of traditional wire bonding, and the electrical performance is effectively improved due to a shorter connection pass.

Figure 1:
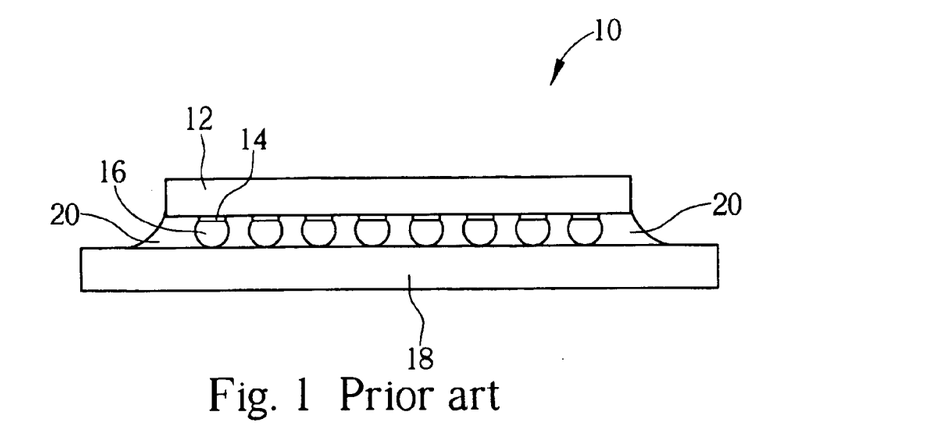
FIG. 1 is a schematic diagram of a prior art package.

Please refer to FIG. 1. FIG. 1 is a schematic diagram of a prior art package. As shown in FIG. 1, a package 10 comprises a chip 12 and a substrate 18. The chip comprises a plurality of solder bump pads respectively connecting to the corresponding solder bumps 16. The solder bump pads 14 connect to the substrate 18 by using the solder bumps 16. In addition, an underfill layer 20 is filled in a gap between the chip 12 and the substrate 18 for tightly connecting the chip 12 with the substrate 18.

According to the prior art package technology, the substrate 18 comprises a plastic (organic) substrate or a ceramic substrate. However, a price of the ceramic substrate is high and a source of the ceramic substrate is limited, so that the plastic substrate with a low price and plentiful sources has become a mainstream material used in packages. Nevertheless, a problem of non-uniform thermal stress always occurs in a package when using the plastic substrate. For example, a coefficient of thermal expansion of the chip 12 is approximately equal to 2.7 ppm/° C., and a coefficient of thermal expansion of the plastic substrate 18 is approximately equal to 17 ppm/° C. Because the chip 12 and the plastic substrate 18 have different coefficients of thermal expansion, a variation of ambient temperature deforms the package, and moreover, the products may fail.

Figure 2A:
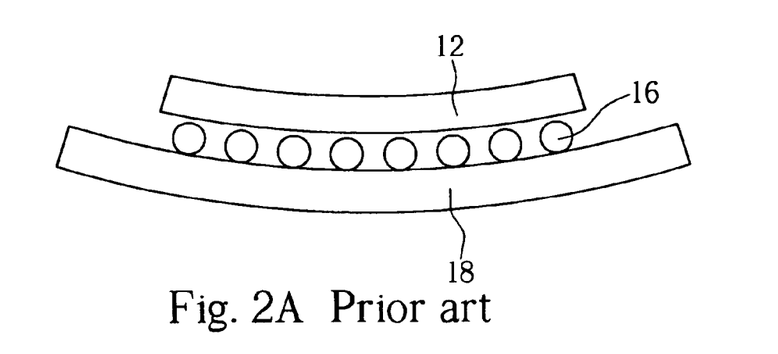
FIG. 2(A) and FIG. 2(B) are a schematic diagrams for illustrating deformation of a package due to a variation of ambient temperature.
Figure 2B:
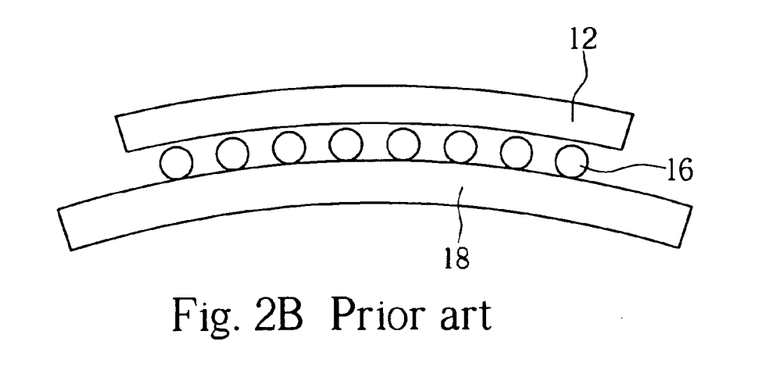

Please refer to FIG. 2(A) and FIG. 2(B). FIG. 2(A) and FIG. 2(B) are a schematic diagrams for illustrating deformation of a package due to a variation of ambient temperature. As mentioned above, the coefficient of thermal expansion of the plastic substrate 18 is larger than that of the chip 12. When ambient temperature rises, the package 10 is bended upwards due to over expansion of the plastic substrate 18, as shown in FIG. 2 (A). Conversely, when ambient temperature falls, the package 10 is bended downwards because the plastic substrate 18 shrinks more than the chip 12 does, as shown in FIG. 2(B). Noticeably, a periphery region of the chip 12 is a region with high thermal stress. As a result, the deformation of the periphery region is more serious than the deformation of the central region of the chip 12, which further leads to forming cracks in the package.

Figure 3:
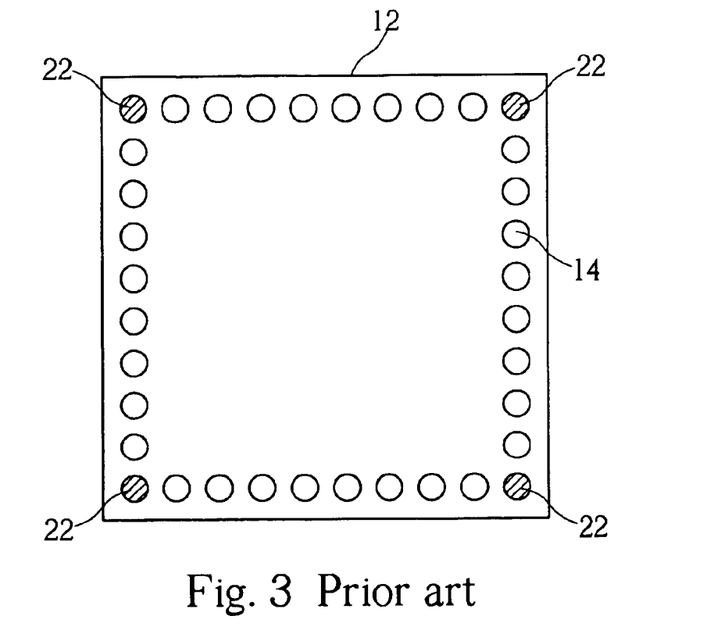
FIG. 3 and FIG. 4 are schematic diagrams of the solder bump pads located on the surface of the chip according to the prior art.
Figure 4:
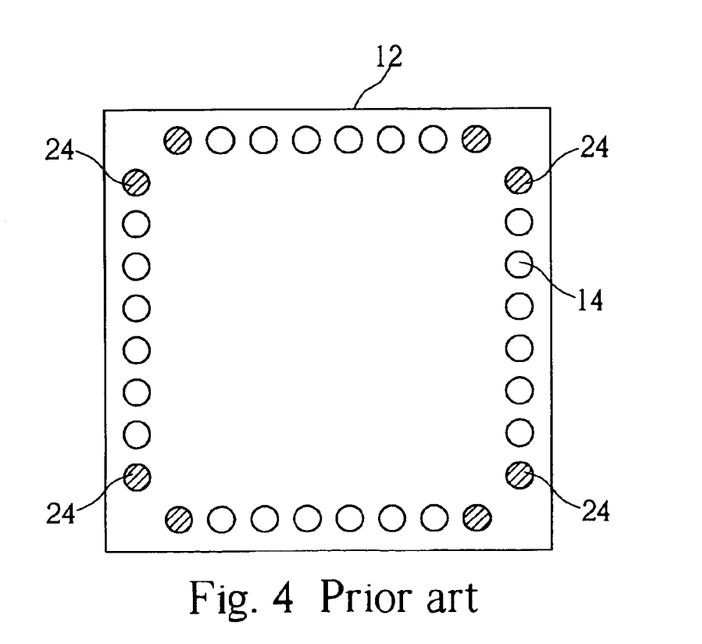

For preventing deformation of the package due to a thermal stress, arrangement of the solder bump pads 14 for connecting the chip 12 with the substrate 18 is changed according to the prior art method. That is, positions of the solder bumps 16 are changed to adjust stress distribution on the chip 12 and the substrate 18. Please refer to FIG. 3 and FIG. 4. FIG. 3 and FIG. 4 are schematic diagrams of the solder bump pads located on the surface of the chip. Generally, the solder bump pads are arranged in a matrix on the chip. For explaining the relationship between positions of the solder bump pads and the stress on the chip, FIG. 3 and FIG. 4 only show solder bump pads located on the region of the chip with high stress (i.e. periphery region). As shown in FIG. 3, the solder bump pads 14 are arranged in a matrix on the chip 12. When ambient temperature varies, the largest thermal stress always occurs on a position of the chip 12 with a maximum distance to neutral point (max DNP). For example, the solder bump pads 22 located at the four corners of the chip 12 are suffered with higher thermal stress, so that the package forms cracks most easily on the positions of the solder bump pads 22. As shown in FIG. 4, the solder bump pads 22 are directly removed to solve the above-mentioned problem according to the prior art method. That is, it is avoided to locate the solder bump pads and the solder bumps at the corners of the chip 12, which is called a bump corner design rule.

As mentioned above, the prior art method removes the solder bump pads 14 located at the four corners of the chip 12. However, the solder bump pads 14 on other high stress regions of the chip 12 are not removed. For example, the solder bump pads 24 shown in FIG. 4 also suffer from higher stress. As a result, as the chip 12 becomes larger, the above-mentioned method cannot effectively solve the thermal stress problem, and thus, reliability of the package is reduced.

SUMMARY OF INVENTION

It is therefore a primary objective of the claimed invention to provide solder pads for improving reliability of a package.

According to the claimed invention, solder pads for improving reliability of a semiconductor package are provided. The package includes a substrate and/or a chip. The solder pad includes a plurality of first solder pads located on a surface of the substrate and/or the chip, and at least a second solder pad located on a predetermined region of the surface of the substrate and/or the chip. Each of the first solder pads has a first diameter. The second solder pad has a second diameter greater than the first diameter so as to sustain a stronger thermal stress on the substrate and/or the chip.

It is an advantage over the prior art that the solder pads with larger sizes are located on the high stress regions of substrate and/or the chip in the claimed invention. The solder pads with larger sizes can sustain stronger thermal stress and mechanical strength. Thus, the claimed invention provides solder pads capable of effectively improving reliability of a package. In addition, the claimed invention controls the sizes of the solder pads by adjusting the sizes of the openings of the photoresist layer in the solder pad process. Thus, it is achievable to improve reliability of the package without adding additional processes and equipment or changing original processes.

These and other objectives of the claimed invention will no doubt become obvious to those of ordinary skill in the art after reading the following detailed description of the preferred embodiment, which is illustrated in the multiple figures and drawings.

DETAILED DESCRIPTION

Figure 5:
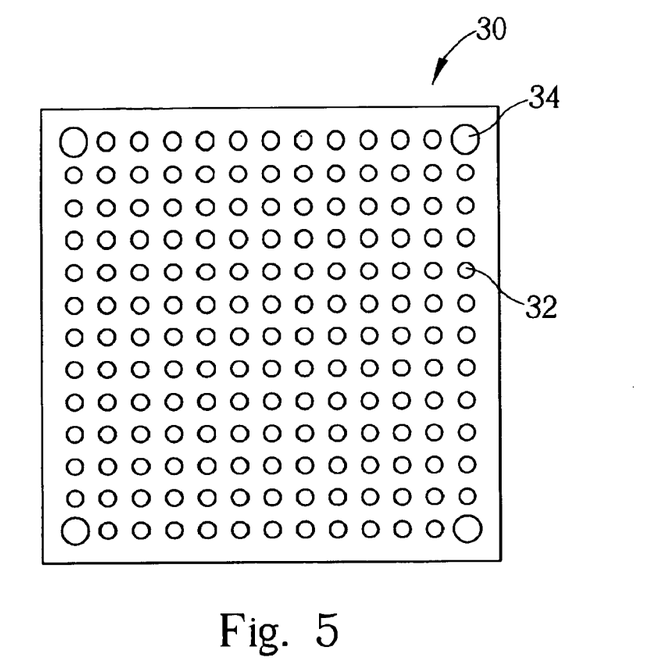
FIG. 5 to FIG. 11 are schematic diagrams for illustrating the solder pads of the embodiments according to the present invention.

Please refer to FIG. 5 to FIG. 11. FIG. 5 to FIG. 11 are schematic diagrams for illustrating the solder pads of the embodiments according to the present invention. The solder pads with larger sizes are located on the high stress regions of a substrate and/or a chip in the present invention. The solder pads with larger sizes can sustain stronger thermal stress and mechanical strength. As shown in FIG. 5, FIG. 5 illustrates the solder pads of the first embodiment. A plurality of first solder pads 32 and a plurality of second solder pads 34 are located on a surface of a substrate and/or a chip 30. The first solder pads 32 are arranged in a matrix at a center region of the substrate 30. The second solder pads 34 are arranged at the four vertexes of the matrix formed by the first solder pads 32. The diameter of the second solder pad 34 is larger than that of the first solder pad 32. In order to ensure reliability of the package during the welding process, the height of the first solder pad 32 is equal or approximately equal to that of the second solder pad 34.

Figure 6:
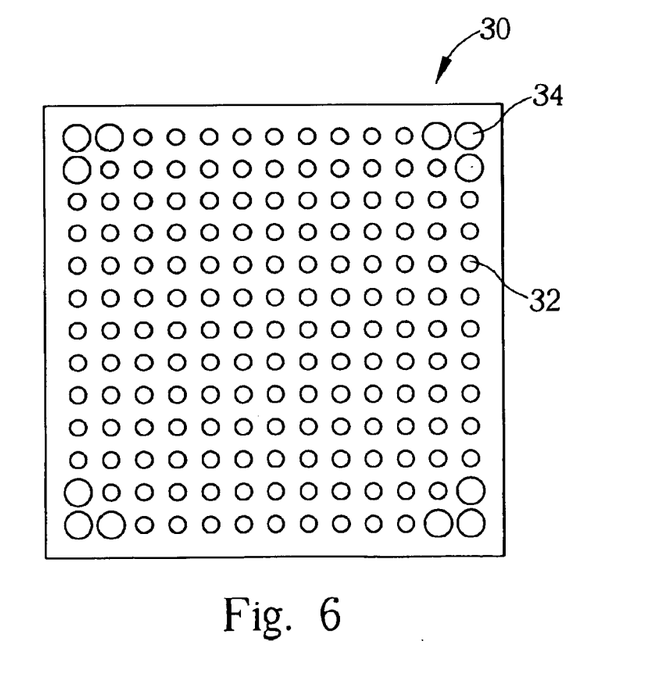

Please refer to FIG. 6. FIG. 6 illustrates the solder pads of the second embodiment of the present invention. As shown in FIG. 6, a plurality of first solder pads 32 and a plurality of second solder pads 34 are located on a surface of a substrate and/or a chip 30. The first solder pads 32 are arranged in a matrix at a center region of the substrate 30. The second solder pads 34 are located at the corners of the matrix formed by the first solder pads 32. In addition, the corners of the matrix include the four vertexes of the matrix and the positions around the vertexes of the matrix. The diameter of the second solder pad 34 is larger than that of the first solder pad 32. In order to ensure reliability of the package during the welding process, the height of the first solder pad 32 is equal or approximately equal to that of the second solder pad 34.

Figure 7:
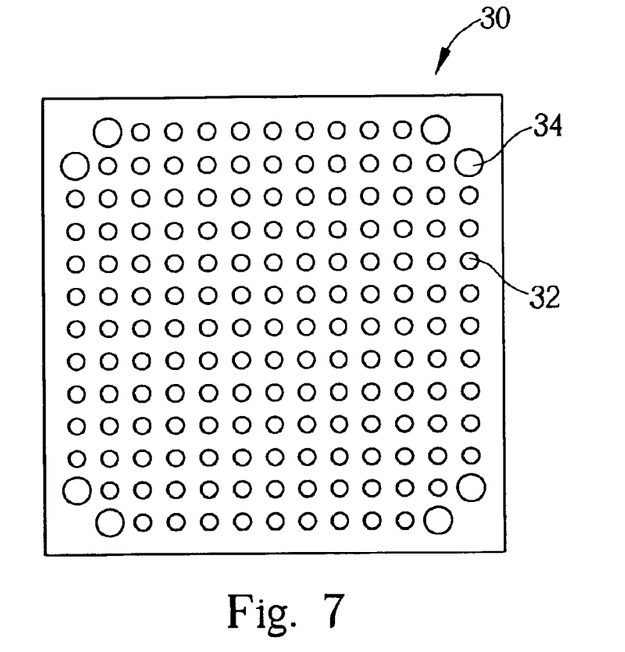

Please refer to FIG. 7. FIG. 7 illustrates the solder pads of the third embodiment of the present invention. As shown in FIG. 7, a plurality of first solder pads 32 and a plurality of second solder pads 34 are located on a surface of a substrate and/or a chip 30. The first solder pads 32 are arranged in a matrix at a center region of the substrate and/or the chip 30. The second solder pads 34 are arranged at the regions near the four vertexes of the matrix formed by the first solder pads 32. For example, the second solder pads 34 are arranged at the positions around the four vertexes of the matrix, and no second solder pads 34 are located at the four vertexes of the matrix. The diameter of the second solder pad 34 is larger than that of the first solder pad 32. In order to ensure reliability of the package during the welding process, the height of the first solder pad 32 is equal or approximately equal to that of the second solder pad 34.

Figure 8:
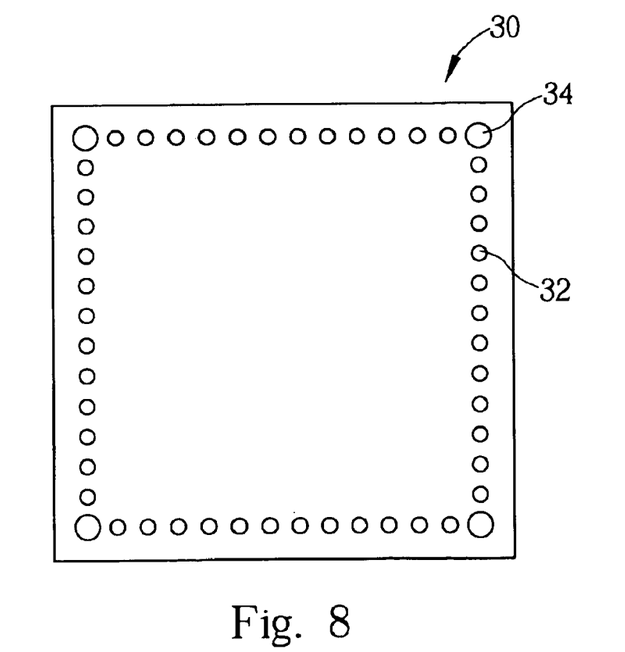

Please refer to FIG. 8. FIG. 8 illustrates the solder pads of the fourth embodiment of the present invention. As shown in FIG. 8, a plurality of first solder pads 32 and a plurality of second solder pads 34 are located on a surface of a substrate and/or a chip 30. The first solder pads 32 are located at the four sides of the substrate and/or the chip 30 and the first solder pads 32 are arranged in a rectangle. The second solder pads 34 are located at the four vertexes of the rectangle formed by the first solder pads 32. The diameter of the second solder pad 34 is larger than that of the first solder pad 32. In order to ensure reliability of the package during the welding process, the height of the first solder pad 32 is equal or approximately equal to that of the second solder pad 34.

Figure 9:
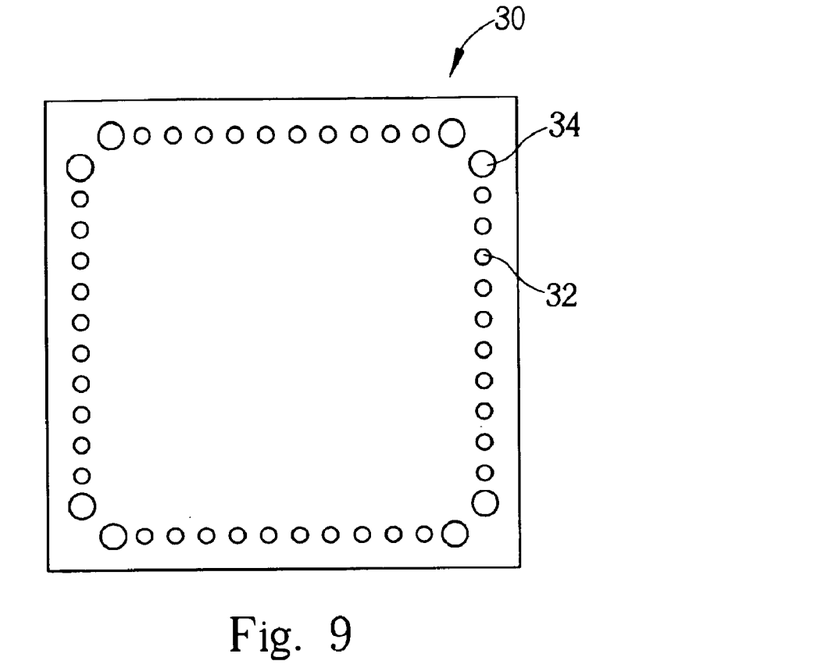

Please refer to FIG. 9. FIG. 9 illustrates the solder pads of the fifth embodiment of the present invention. As shown in FIG. 9, a plurality of first solder pads 32 and a plurality of second solder pads 34 are located on a surface of a substrate and/or a chip 30. The first solder pads 32 are located at the four sides of the substrate and/or the chip 30 and the first solder pads 32 are arranged in a rectangle. The second solder pads 34 are located at the regions near the four vertexes of the rectangle formed by the first solder pads 32. For example, the second solder pads 34 are arranged at the positions around the four vertexes of the rectangle, and no second solder pads 34 are located at the four vertexes of the rectangle. The diameter of the second solder pad 34 is larger than that of the first solder pad 32. In order to ensure reliability of the package during the welding process, the height of the first solder pad 32 is equal or approximately equal to that of the second solder pad 34.

Figure 10:
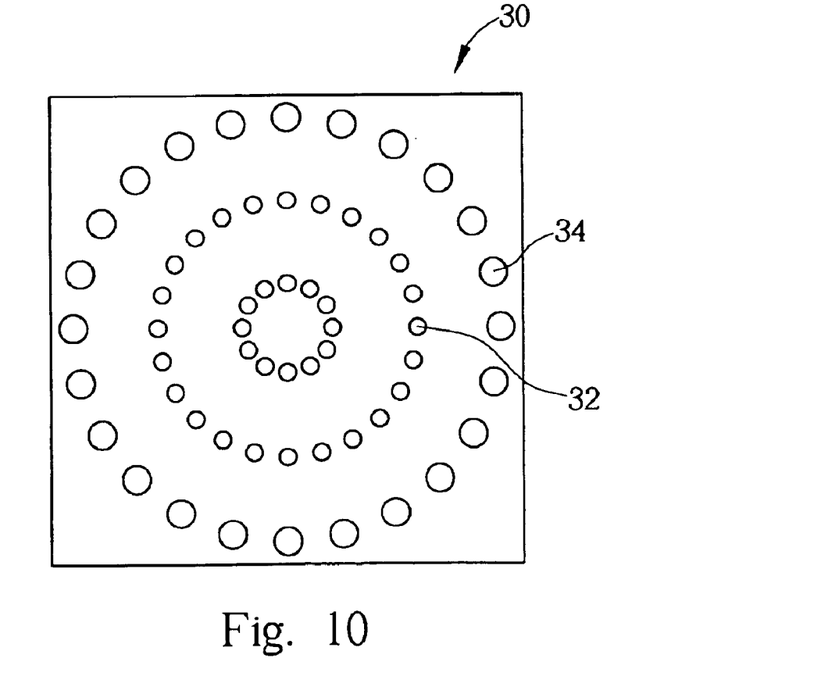

Under ideal conditions, taking the center of the substrate and/or the chip as a center of a circle, the solder pads located at the circumference of the same concentric circle are suffered with approximately equal thermal stress. The present invention arranges solder pads with different sizes according to the above-mentioned stress distribution. Please refer to FIG. 10. FIG. 10 illustrates the solder pads of the sixth embodiment of the present invention. As shown in FIG. 10, a plurality of first solder pads 32 and a plurality of second solder pads 34 are located on a surface of a substrate and/or a chip 30. The first solder pads 32 are located at circumferences of a plurality of concentric circles. The second solder pads 34 are located at a high stress region, which is farthest from the center of the substrate and/or the chip 30. That is, the second solder pads 34 are located at the circumference of the maximum circle on the substrate 30. The diameter of the second solder pad 34 is larger than that of the first solder pad 32. In order to ensure reliability of the package during the welding process, the height of the first solder pad 32 is equal or approximately equal to that of the second solder pad 34.

Figure 11:
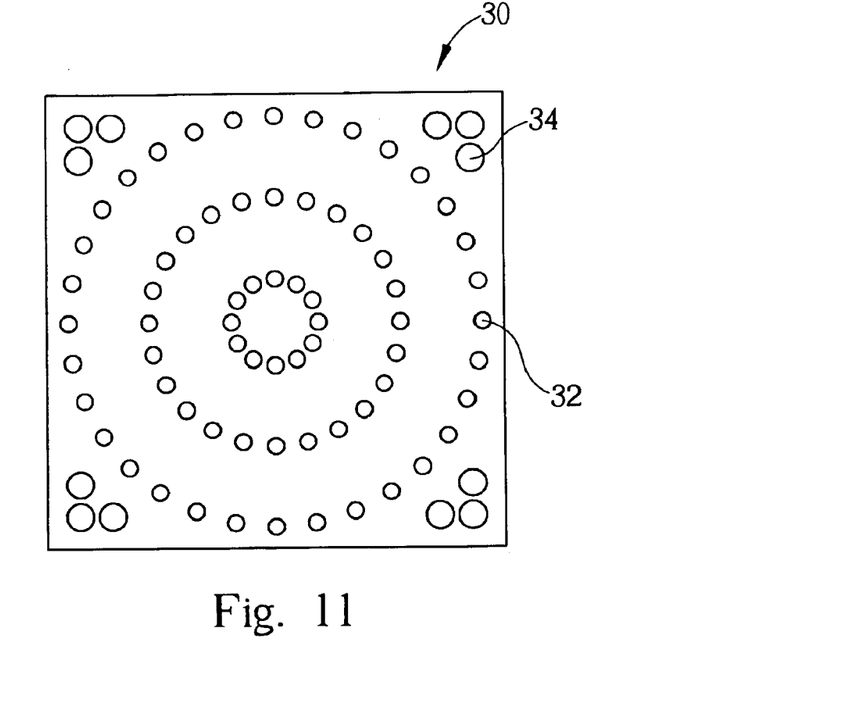

Please refer to FIG. 11. FIG. 11 illustrates the solder pads of the seventh embodiment of the present invention. As shown in FIG. 11, a plurality of first solder pads 32 and a plurality of second solder pads 34 are located on a surface of a substrate 30. The first solder pads 32 are located at circumferences of a plurality of concentric circles. The second solder pads 34 are located at the corners outside the concentric circles formed by the first solder pads 32. The diameter of the second solder pad 34 is larger than that of the first solder pad 32. In order to ensure reliability of the package during the welding process, the height of the first solder pad 32 is equal or approximately equal to that of the second solder pad 34.

The present invention can be applied not only in a flip-chip package, but also in a ball grid array (BGA) package. As a result, in all embodiments of the present invention, the substrate 30 can be a semiconductor wafer, and the first solder pads 32 and the second solder pads 34 can be solder bump pads for connecting the semiconductor wafer with the plastic substrate or the ceramic substrate. The substrate 30 comprises a plastic substrate, a ceramic substrate, or a printed circuit board. The first solder pads 32 and the second solder pads 34 are solder ball pads for connecting the above-mentioned substrate with other chips or substrates.

Figure 12:
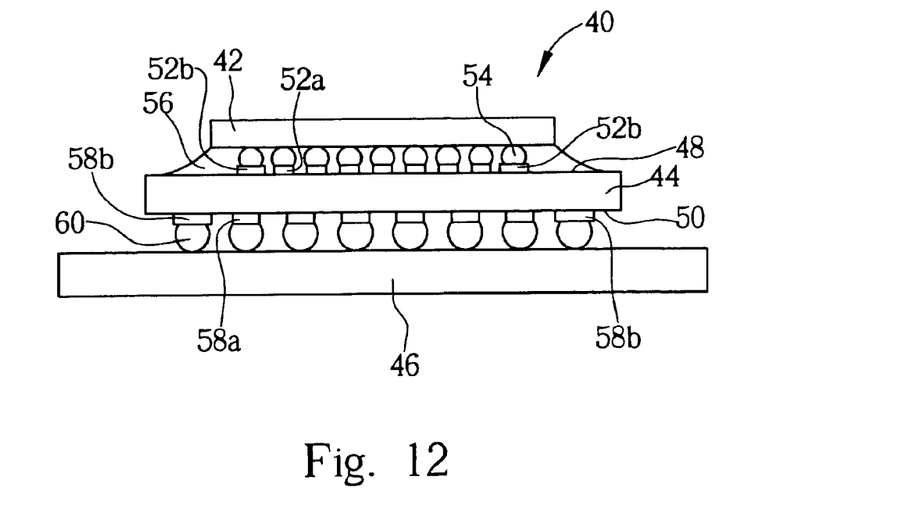
FIG. 12 is a schematic diagram of a package according to the present invention.

Please refer to FIG. 12. FIG. 12 is a schematic diagram of a package according to the present invention. As shown in FIG. 12, a package 40 comprises a chip 42, a substrate 44, and a print circuitboard 46. An underfill layer 56 is filled in a gap between the chip 42 and the substrate 44. The substrate 44 is a plastic substrate or a ceramic substrate. A plurality of first solder bump pads 52a and a plurality of second solder bump pads 52b are located on a first surface of the substrate 44, and each of the first solder bump pads 52a has a smaller diameter than each of the second solder bump pad 52b. Additionally, each of the first solder bump pads 52a and the second solder bump pads 52b connects to a solder bump 54, and the first solder bump pads 52a and the second solder bump pads 52b connect to the chip 42 by use of the solder bumps 54. Furthermore, a plurality of first solder ball pads 58a and a plurality of second solder ball pads 58b are located on a second surface of the substrate 44, and each of the first solder ball pads 58a has a smaller diameter than each of the second solder ball pads 58b. Each of the first solder ball pads 58a and the second solder ball pads 58b connects to a solder ball 60, and the first solder ball pads 58a and the second solder ball pads 58b connect to the print circuit board 46 by use of the solder balls 60. Noticeably, in order to make the package sustain higher thermal stress and high r fatigu strength, the solder bump pads 52a and 52b or the solder ball pads 58a and 58b should hav at least two different kinds of diameters. The second solder bump pads 52b or the second solder ball pads 58b with larger sizes arm used to sustain a stronger thermal stress during a thermal process. The arrangement of the first solder bump pads the second solder bump pads 52b can refer to the first embodiment to the seventh embodiment of the present invention. Likewise, the arrangement of the first solder ball pads 56a and the second solder ball pads 58b can refer to the first embodiment to the seventh embodiment of the resent invention.

In addition, the first solder bump pads 52a and the second solder bump pads 52b can be located on a surface of the chip 42 in the package 40 shown in FIG. 12. Then, each of the first solder bump pads 52a and the second solder bump pads 52b connects to a solder bump 54, and uses the solder bump 54 to connect to the substrate 44. Conversely, the first solder ball pads 58a and the second solder ball pads 58b can be located on a surface of the print circuit board 46. Each of the first solder ball pads 58a and the second solder ball pads 58b connects to a solder ball 60, and uses the solder ball 60 to connect to the substrate 44.

In comparison with the prior art, the solder pads with larger sizes are located on the high stress regions of the substrate in the claimed invention. The solder pads with larger sizes can sustain stronger thermal stress and mechanical strength. Thus, the claimed invention provides solder pads capable of effectively improving reliability of a package. In addition, the claimed invention controls the sizes of the solder pads by adjusting the sizes of the openings of the photoresist layer in the solder pad process. Thus, it is achievable to improve reliability of the package without adding additional processes or changing original processes.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. Solder pads for improving reliability of a package, the package comprising a substrate, the solder pads with two sizes of diameters comprising:
    a plurality of first solder pads arranged in a first circle on a surface of the substrate, the first circle being within the scope of the surface of the substrate, each of the first solder pads having a first diameter; and
    a plurality of second solder pads arranged on the surface of the substrate and out of the first circle, each of the second solder pads having a second diameter greater than the first diameter to sustain a stronger thermal stress and a stronger fatigue strength.

2. The solder pads of claim 1 wherein the substrate comprises a plastic substrate.

3. The solder pads of claim 1 wherein the substrate comprises a ceramic substrate.

4. The solder pads of claim 1 wherein the substrate comprises a printed circuit board (PCB).

5. The solder pads of claim 1 wherein the substrate comprises a chip.

6. The solder pads of claim 1, further comprising the plurality of first solder pads arranged in a plurality of circles at a center region of the substrate and within the first circle.

7. The solder pads of claim 1 wherein the second solder pads are arranged in the circumferences of a plurality of concentric circles on the substrate.

8. The solder pads of claim 7 wherein the second solder pads on each of the concentric circle circumferences are arranged with an equal interval.

9. The solder pads of claim 1 wherein the first circle is a maximum circle within the scope of the surface of the substrate, and the second solder pads are arranged at the outside of the maximum circle.

10. The solder pads of claim 1 wherein the second solder pads are arranged in a second circle, and the second circle is a maximum circle within the scope of the surface of the substrate.

11. The solder pads of claim 1 wherein a corner region of the substrate comprises at least a grounded solder pad.

12. The solder pads of claim 1 wherein each of the first solder pads and each of the second solder pads comprise a solder bump pad, the solder bump pad connecting to a solder bump and using the solder bump to connect to a chip.

13. The solder pads of claim 12 wherein an underfill layer is filled in a gap between the chip and the substrate.

14. The solder pads of claim 1 wherein each of the first solder pads and each of the second solder pads comprise a solder ball pad, the solder ball pad connecting to a solder ball and using the solder ball to connect to a printed circuit board.

15. Solder pads with two sizes of diameters comprising:
    a substrate;
    a plurality of first solder bump pads positioned on a first surface of the substrate to occupy the entire first surface of the substrate except the corners, portions of the first solder bump pads being arranged in a first rectangular array at a center region of the first surface, and portions of the first solder bump pads being arranged out of the first rectangular array, each of the first solder bump pads having a first diameter;
    at least a second solder bump pad positioned on a first corner region of the first surface, the second solder bump pad having a second diameter greater than the first diameter, each of the first solder bump pads and the second solder bump pad being connected to a solder bump that is connected to a chip;

a plurality of first solder ball pads positioned on a second surface of the substrate to occupy the entire second surface of the substrate except the corners, portions of the first solder ball pads being arranged in a second rectangular array at a center region of the second surface, and portions of the first solder ball pads being arranged out of the second rectangular array, each of the first solder ball pads having a third diameter; and at least a second solder ball pad positioned on a second corner region of the second surface, the second solder ball pad having a fourth diameter greater than the third diameter, each of the first solder ball pads and the second solder ball pad being connected to a solder ball that is connected to a printed circuit board.

16. The solder pads of claim 15 wherein the substrate comprises a plastic substrate.

17. The solder pads of claim 15 wherein the substrate comprises a ceramic substrate.

18. The solder pads of claim 15 wherein the first corner region and the second corner region comprise a high stress region.

19. The solder pads of claim 15 wherein the portions of the first solder bump pads arranged out of the first rectangular array are aligned to the second solder bump pads on the first corner region.

20. The solder pads of claim 15 wherein the portions of the first solder ball pads arranged out of the second rectangular array are aligned to the second solder ball pad on the second corner region.

* * * * *